United States Patent [19]

Morris et al.

[11] 4,247,849
[45] Jan. 27, 1981

[54] CONSTANT CURRENT VOLTAGE SENSING CIRCUIT

[75] Inventors: Phillip D. Morris, Flower Mound; John H. Alford, Dallas, both of Tex.

[73] Assignee: Beta Products, Inc., Carrollton, Tex.

[21] Appl. No.: 22,090

[22] Filed: Mar. 19, 1979

[51] Int. Cl.³ ............................................. G08B 21/00
[52] U.S. Cl. .................................. 340/660; 340/662; 324/126
[58] Field of Search ................... 340/660, 662; 324/96, 324/119, 126; 361/91

[56] References Cited

U.S. PATENT DOCUMENTS

| | | | |
|---|---|---|---|
| 3,665,442 | 5/1972 | Brooks | 340/660 |
| 3,991,367 | 11/1976 | Chapman et al. | 324/126 |
| 4,025,850 | 5/1977 | Spiteri | 324/119 |

*Primary Examiner*—Gerald L. Brigance

[57] ABSTRACT

A current limiting voltage sensing circuit especially suited as an annunciator input circuit is disclosed. It includes a radiation emitting device circuit, a current limiting circuit for maintaining the current supplied to the voltage sensing circuit at a substantially constant value while supplying the needed current to the radiation emitting device circuit, and a radiation sensitive device circuit coupled to the radiation emitting device and electrically isolated from it for converting from the radiation signal into an electrical signal. In one arrangement, the input to the voltage sensing circuit is a full-wave rectifier so that it can be used for detecting an ac voltage or a dc voltage in either direction. One arrangement of the current limiting circuit includes a field effect transistor with the drain-to-source forming a variable resistance current path for maintaining the current supplied to the voltage sensing circuit at a substantially constant value, and a circuit connecting the source of the field effect transistor in a feedback relationship to the gate. In one arrangement, the feedback circuit is a resistor in series with the radiation emitting device which is a light emitting diode. The radiation sensitive device in such an arrangement is a photodiode or phototransistor which forms an optical coupler with the light emitting diode.

5 Claims, 4 Drawing Figures

CONSTANT CURRENT VOLTAGE SENSING CIRCUIT

BACKGROUND OF THE INVENTION

1. Field of the Invention

The present invention relates generally to voltage sensing devices, and in one of its aspects, to an input circuit for an annunciator.

2. Description of the Prior Art

An industrial annunciator monitors abnormalities within some system such as a refinery, chemical plant or power plant. Sensing devices such as mercoid switches detect when some abnormality has occurred. The abnormality could be too high a temperature in a boiler, or loss of pressure in a fluid line, to a dangerous flow rate. Often in the past, voltage sensing devices have been made up of transformers and resistive networks which allow considerable current to run through the sensing device itself to the system being monitored. Normally, many of the points to be monitored would be series contacts in the line supplying power to a motor or other system to be monitored. In order to limit the total amount of current going to the motor for example so that the motor would not still be supplied enough current to operate when a single contact was open, the resistance of the sensing device was made fairly high, but by making the resistance of the sensing circuit higher, there often was not sufficient current to actuate the sensing circuits when several of the series contacts were open. The total number of sensing devices that could be operational at any one time was thus fairly limited, typically three or four.

U.S. Pat. No. 4,021,683 issued to Splatt and U.S. Pat. No. 4,065,669 issued to Bogel both show the use of diode rectifier bridges and optical couplers in switching circuits. Both of these circuits are literally and functionally in series with the load in normal operation. Splatt, for instance, is designed to control the supply of alternating current to the load.

Various devices have beeen proposed for monitoring or sensing some event that has happened elsewhere in a circuit. It is common in such monitoring or sensing devices which use optical couplers for electrical isolation purposes to try to protect the light emitting device which is usually a light emitting diode (LED) from excessive voltage or current by using a resistor in series with the LED. The series resistor-LED combination is then combined with a zener diode facing in the opposite direction from the LED as shown in U.S. Pat. No. 3,848,140 issued to Guermeur et al. and U.S. Pat. No. 3,967,257 issued to Hager in order to protect the LED from excessive reverse bias voltage in one direction and excessive current in the other. Another arrangement to protect the LED is to include a plurality of series diodes in parallel with the resistor LED series combination, facing the same direction as the LED as shown in U.S. Pat. No. 4,121,122 issued to Pokrandt and Canadian Patent No. 958080 issued to Oulton. This arrangement increases the sensitivity of the LED for testing low levels of current, but is also designed to protect the LED from excessive current. In all of these cases, however, it is the current to the LED that is being limited and the intent is to protect the LED.

SUMMARY OF THE INVENTION

The present invention concerns a method and apparatus for sensing the presence of a voltage. The apparatus includes a radiation emitting device circuit including a device such as an LED which emits radiation when current above a certain threshold level passes through it, a current limiting circuit for maintaining the current supplied to the entire voltage sensing circuit at a substantially constant value and supplying current above the threshold level to the radiation emitting device when the voltage to be sensed is present. A radiation signal is, therefore, emitted from the radiation emitting device corresponding to the presence or absence of the voltage to be sensed. The apparatus also includes a radiation sensitive device circuit coupled to the radiation emitting device and electrically isolated from the radiation emitting device circuit for converting from the radiation signal emitted into an electrical signal. One arrangement of the current limiting voltage sensing circuit includes a full-wave rectifier input to facilitate detecting an ac signal or a dc signal in either direction across the input terminals. The current limiting circuit can be two totally separate circuits, one circuit for maintaining the current supply to the voltage sensing circuit at a substantially constant value and a separate circuit for supplying current above the threshold level to the radiation emitting device when the voltage to be sensed is present.

One arrangement of the constant current voltage sensing circuit especially suited for an annunciator input circuit for detecting a significant voltage across a pair of contacts such as in a relay, includes a full-wave rectifier having a pair of input terminals for electrically connecting across the pair of contacts and a pair of output terminals, a field effect transistor (FET) having a drain connected to the positive terminal of the full-wave rectifier output and a gate connected to the negative terminal of the full-wave rectifier output. A series combination of an impedance circuit which can be simply a resistor and the LED connects the source of the FET in a feedback relationship to the gate. "Significant voltage" is used here to mean a voltage greater than normally found across a pair of normally functioning closed contacts.

In an annunciator system which must monitor several points such as series contacts, the circuit of this apparatus can be used as an input circuit to the annunciator allowing the fault condition of several points to be detected simultaneously. At the same time, by choosing a value of constant current which is sufficiently low, the annunciator input circuit does not provide a significant current path around its associated pair of contacts when the associated pair of contacts is open. The annunciator input circuit of this invention can also be used for detecting resistive contacts which should be replaced. The input circuit of this invention thus acts to both isolate the annunciator from the monitored apparatus and to isolate one contact of an open pair of contacts from the other.

These and other objects, advantages and features of this invention will be apparent from the following description taken with reference to the accompanying drawings, wherein is shown the preferred embodiments of the invention.

DETAILED DESCRIPTION

Figure 1:
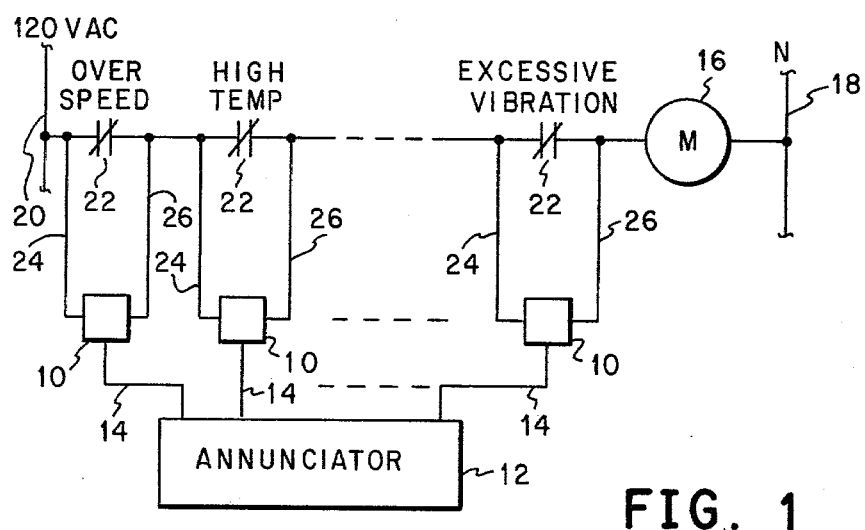
FIG. 1 is a schematic representation of an annunciator system connected to a system to be monitored.

Referring now to the drawing and in particular to FIG. 1, an annunciator system comprising annunciator input circuits 10, an annunciator 12, and means 14 for electrically connecting annunciator input circuits 10 to annunciator 12 monitors a system such as a factory having a load such as motor 16 operating from a power supply having a neutral 18 and a 120 volt ac supply line 20. Motor 16 is powered by 120 volt ac supply line 20 through a number of series pairs of contacts 22. Each pair of contacts 22 is closed during normal operation of the system, but opens in the event of an emergency situation such as motor overspeed, too high a temperature, excessive vibration, etc. Each annunciator input circuit 10 is electrically connected across the pair of contacts 22 by a pair of input terminals 24 and 26.

Figure 2:
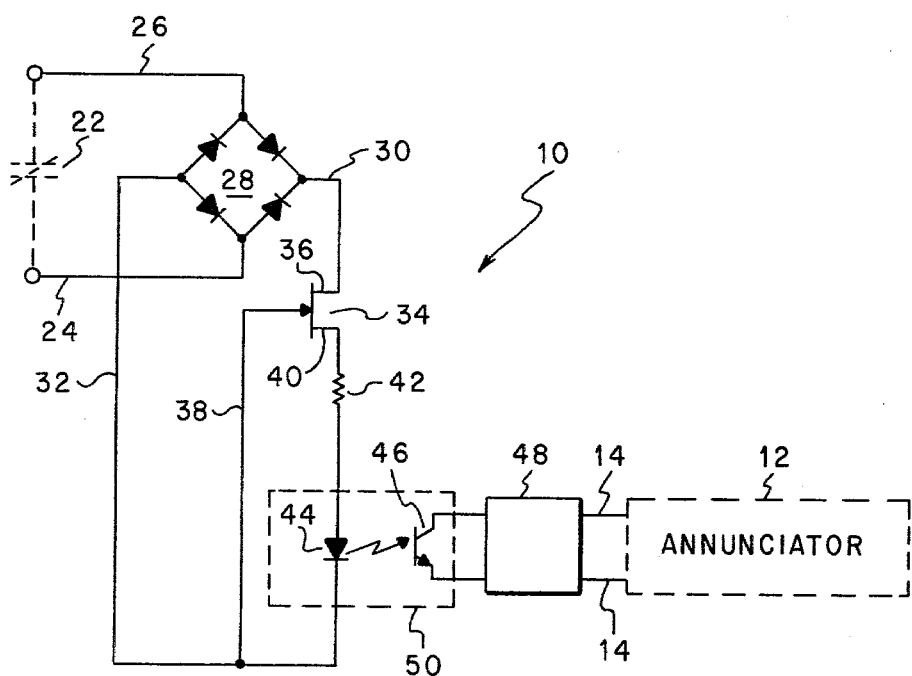
FIG. 2 is an electrical schematic of an annunciator input circuit in accordance with the present invention.

Referring to FIG. 2, a preferred embodiment of the present invention suitable as an annunciator input circuit for detecting a significant voltage across a pair of contacts 22 includes a full-wave rectifier 28 having a pair of input terminals 24 and 26 for electrically connecting across the pair of contacts 22 and a pair of output terminals, one of the output terminals being a positive terminal 30 and one being a negative terminal 32 where positive and negative are relative terms and not absolute with respect to ground.

Annunciator input circuit 10 also includes an FET 34 having a drain 36 connected to positive terminal 30, a gate 38 connected to negative terminal 32 and a source 40. A resistor 42 and an LED 44 connected in series with resistor 42 connect source 40 to gate 38. A photosensitive device circuit including a photosensitive device such as phototransistor 46 and a shaper-amplifier 48 is optically coupled to and electrically isolated from LED 44. The photosensitive device circuit converts from the light signal emitted from LED 44 into an electrical signal acceptable by annunciator 12 through means 14 for electrically connecting annunciator input circuit 10 to annunciator 12. Often, LED 44 and phototransistor 46 or their equivalents will form an optical coupler 50.

Figure 3:
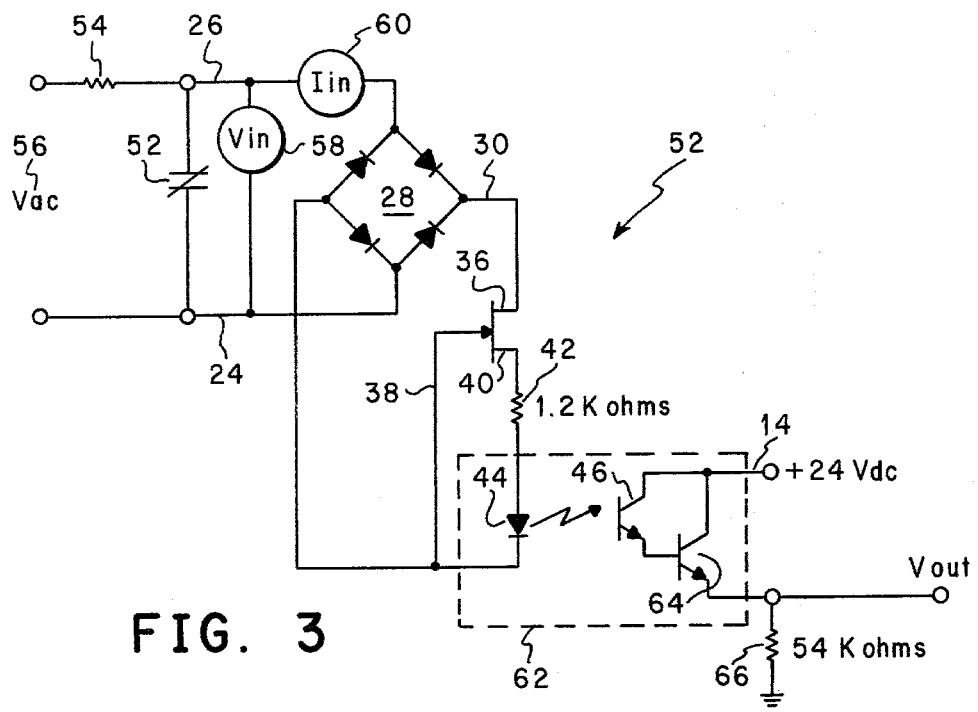
FIG. 3 is an electrical schematic of an experimental circuit according to the present invention.
Figure 4:
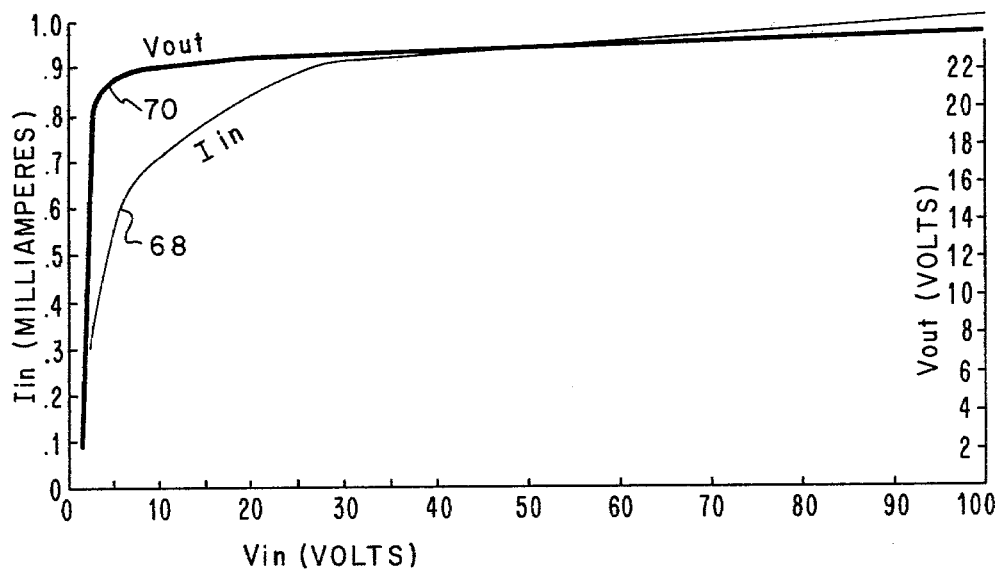
FIG. 4 is a chart showing data gathered on a typical circuit of FIG. 3.

Referring now to FIG. 3, an experimental circuit 52 includes an annnunciator input circuit similar to that of FIG. 2 wherein like parts are numbered the same. Input terminals 24 and 26 are connected across a pair of contacts 52. A resistor 54 is connected in series with power source $V_{ac}$ 56 for driving the circuit. A volt meter 58 measures the input voltage across input terminals 24 and 26, and an ammeter 60 measures the input current to the annunciator input circuit. An optical coupler 62 includes LED 44 and phototransistor 46 combined with transistor 64 to form a Darlington pair. The output voltage, Vout, is taken across a 54 K ohms load resistor 66. Typical results are shown in the graph of FIG. 4 which shows that the input current $I_{in}$ reaches a nearly constant value once the input voltage $V_{in}$ gets near 30 volts as shown by curve 68, but that the output voltage $V_{out}$ reaches nearly full signal once the input voltage is in the range of 7 to 10 volts as shown by curve 70. It can thus be seen from this experimental data that for a 120 volt input as described with reference to FIG. 1, ten annunciator input circuits 10 could operate at a single time without giving false readings. This compares to approximately four simultaneously operating annunciator input circuits for the old transformer annunciator input circuits.

A specific embodiment of the present invention has been disclosed, but it can be easily seen that LED 44 is but one example of a radiation emitting device circuit including a device which emits radiation when current above a certain threshold level passes through it, and that the photosensitive device circuit made up of phototransistor 46 and shaper-amplifier 48 is only one example of a radiation sensitive device circuit for converting from the radiation signal emitted from the radiation emitting device into an electrical signal. FET 34 is more generally an electronic device with at least a first terminal and a second terminal forming a current path therebetween in series with the impedance circuit of resistor 42 in the radiation emitting device circuit of LED 44, and a control terminal to control the effective resistance between the first terminal and the second terminal. The control terminal corresponding to gate 38 is connected to a point on the side of the impedance circuit remote from the electronic device, a point which might also be on the side of the radiation emitting device circuit remote from the electronic device. Even more generally, FET 34 in conjunction with resistor 42 and LED 44 is one embodiment of a current limiting circuit for maintaining a current supplied to the voltage sensing circuit at a substantially constant value and supplying current above the threshold level to the radiation emitting device which is LED 44 when the voltage to be sensed is present so that a radiation signal is emitted from the radiation emitting device corresponding to the presence or absence of the voltage to be sensed.

From the foregoing it will be seen that this invention is one well adapted to attain all of the ends and objects hereinabove set forth, together with other advantages which are obvious and which are inherent to the apparatus.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the accompanying drawings is to be interpreted as illustrative and not in a limiting sense.

The invention having been described, what is claimed is:

1. A voltage sensing circuit comprising in combination:
   a radiation emitting device circuit including a device which emits radiation when current above a certain threshold level passes through it;
   an impedance circuit;
   an electronic device with at least a first terminal and a second terminal forming a current path therebetween in series with the impedance circuit and the radiation emitting device circuit, and a control terminal to control the effective resistance between the first terminal and the second terminal, and the control terminal is connected to a point on the side of the impedance circuit remote from the electronic device wherein the impedance circuit and the electronic device act together as a current limiting circuit for limiting the current supplied to the voltage sensing circuit to a substantially predetermined value and supplying current above the threshold level to the radiation emitting device when the voltage to be sensed is present across the series combination of radiation emitting device, impedance circuit and electronic device whereby a radiation signal is emitted from the radiation emitting device corresponding to the presence or absence of the voltage to be sensed; and a radiation sensitive device circuit coupled to the radiation emitting device and electrically isolated from the radiation emitting device circuit for converting from the radiation signal emitted from the radiation emitting device into an electrical signal.

2. A voltage sensing circuit according to claim 1 for sensing a voltage between two points further comprising a full-wave rectifier having a pair of input terminals for electrically connecting across the two points and a pair of output terminals connected across the circuit comprising the radiation emitting circuit and the current limiting circuit.

3. A voltage sensing circuit comprising in combination:

a radiation emitting device circuit including a device which emits radiation when current above a certain threshold level passes through it;

a field effect transistor with the drain to source forming a variable resistance current path in series with the radiation emitting device;

a circuit electrically connecting the source of the field effect transistor in a feedback relationship to the gate of the field effect transistor, wherein the field effect transistor in combination with the circuit electrically connecting the source in a feedback relationship to the gate limits the current supplied to the voltage sensing circuit to a substantially predetermined value and supplies current above the threshold level to the radiation emitting device when the voltage to be sensed is present across the series combination of radiation emitting device and source to drain whereby a radiation signal is emitted from the radiation emitting device corresponding to the presence or absence of the voltage to be sensed; and a radiation sensitive device circuit coupled to the radiation emitting device and electrically isolated from the radiation emitting device circuit for converting from the radiation signal emitted from the radiation emitting device into an electrical signal.

4. A voltage sensing circuit according to claim 3 for sensing a voltage wherein the circuit electrically connecting the source in a feedback relationship to the gate comprises a resistor, further comprising a full-wave rectifier having a pair of input terminals for electrically connecting across the source of the voltage to be sensed and a pair of output terminals with the positive output terminal connected to the drain side and the negative output terminal connected to the gate side of the circuit comprising the radiation emitting circuit and the current limiting circuit.

5. An annunciator input circuit for detecting a significant voltage across a pair of contacts, comprising in combination:

a full-wave rectifier having a pair of input terminals for electrically connecting across the pair of contacts and a pair of output terminals, one of the output terminals being a positive terminal and one being a negative terminal;

a field effect transistor having a drain connected to the positive terminal, a gate connected to the negative terminal, and a source;

a resistor;

a light emitting diode in series with the resistor, wherein the series combination of resistor and light emitting diode connects the source to the gate; and a photosensitive device circuit optically coupled to and electrically isolated from the light emitting diode for converting from the light signal emitted from the light emitting diode into an electrical signal acceptable by the annunciator.

* * * * *

UNITED STATES PATENT AND TRADEMARK OFFICE
CERTIFICATE OF CORRECTION

PATENT NO. : 4,247,849
DATED : January 27, 1981
INVENTOR(S) : Phillip D. Morris, Et Al.

It is certified that error appears in the above-identified patent and that said Letters Patent are hereby corrected as shown below:

The title should read ---CURRENT LIMITING VOLTAGE SENSING CIRCUIT---

In Column 1, line 16, "to" should read ---or---

Signed and Sealed this

Fourteenth Day of July 1981

[SEAL]

Attest:

Attesting Officer

GERALD J. MOSSINGHOFF

Commissioner of Patents and Trademarks